United States Patent
Ingle et al.

(10) Patent No.: US 10,204,796 B2
(45) Date of Patent: *Feb. 12, 2019

(54) METHODS FOR SELECTIVE ETCHING OF A SILICON MATERIAL USING HF GAS WITHOUT NITROGEN ETCHANTS

(71) Applicant: Applied Materials, Inc., Santa Clara, CA (US)

(72) Inventors: Nitin K. Ingle, San Jose, CA (US); Anchuan Wang, San Jose, CA (US); Zihui Li, Santa Clara, CA (US); Mikhail Korolik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,083

(22) Filed: Nov. 27, 2017

(65) Prior Publication Data

US 2018/0082849 A1  Mar. 22, 2018

Related U.S. Application Data

(63) Continuation of application No. 15/043,955, filed on Feb. 15, 2016, now Pat. No. 9,831,097.

(Continued)

(51) Int. Cl.
*H01L 21/3065* (2006.01)
*H01L 21/308* (2006.01)
(Continued)

(52) U.S. Cl.
CPC .... *H01L 21/3065* (2013.01); *H01J 37/32357* (2013.01); *H01L 21/3081* (2013.01);
(Continued)

(58) Field of Classification Search
CPC ............. H01L 21/3065; H01L 21/3081; H01L 21/31116; H01L 21/31122; H01L 21/32137; H01L 37/32357
See application file for complete search history.

(56) References Cited

U.S. PATENT DOCUMENTS

| | | | |
|---|---|---|---|
| 5,350,480 A * | 9/1994 | Gray | ................. H01L 21/02071 134/31 |
| 7,683,447 B2 | 3/2010 | Wang et al. | |

(Continued)

FOREIGN PATENT DOCUMENTS

WO  0046838 A2  8/2000

OTHER PUBLICATIONS

Nakazawa, Yutaka, et al. "Selective Etching of Silicon Native Oxide with Remote-Plasma-Excited Anhydrous Hydrogen Fluoride", Japanese Journal of Applied Physics., vol. 37, pp. L 536-L 538 (1998).

(Continued)

*Primary Examiner* — Duy Vu N Deo
(74) *Attorney, Agent, or Firm* — Patterson + Sheridan, LLP

(57) ABSTRACT

The present disclosure provides methods for etching a silicon material in a device structure in semiconductor applications. In one example, a method for etching features in a silicon material includes performing a remote plasma process formed from an etching gas mixture including HF gas without nitrogen etchants to remove a silicon material disposed on a substrate.

16 Claims, 3 Drawing Sheets

Related U.S. Application Data

(60) Provisional application No. 62/269,695, filed on Dec. 18, 2015.

(51) Int. Cl.
*H01J 37/32* (2006.01)
*H01L 21/311* (2006.01)
*H01L 21/3213* (2006.01)

(52) U.S. Cl.
CPC .. *H01L 21/31116* (2013.01); *H01L 21/31122* (2013.01); *H01L 21/32137* (2013.01)

(56) References Cited

U.S. PATENT DOCUMENTS

| | | | |
|---|---|---|---|
| 7,767,977 B1 | 8/2010 | Godet et al. | |
| 7,888,653 B2 | 2/2011 | Kellerman et al. | |
| 8,101,510 B2 | 1/2012 | Godet et al. | |
| 8,808,563 B2 | 8/2014 | Wang et al. | |
| 9,431,268 B2 | 8/2016 | Lill et al. | |
| 9,564,338 B1 * | 2/2017 | Zhang | H01L 21/3065 |
| 9,831,097 B2 * | 11/2017 | Ingle | H01L 21/3065 |
| 2006/0057821 A1 | 3/2006 | Lee et al. | |
| 2012/0135273 A1 | 5/2012 | Horng et al. | |
| 2012/0135543 A1 | 5/2012 | Shin et al. | |
| 2013/0089988 A1 | 4/2013 | Wang et al. | |
| 2014/0038311 A1 | 2/2014 | Kim et al. | |
| 2015/0155177 A1 | 6/2015 | Zhang et al. | |

OTHER PUBLICATIONS

Han, Yong-Pil, "HF Vapor Etching and Cleaning of Silicon Wafer Surfaces", Massachusetts Institute of Techology, Department of Chemical Engineering, Jul. 1999. (186 pages), Library Archives, Feb. 10, 2000.

Tuda, Mutumi, et al., "Highly Selective Removal of Residual Deposited Films and Oxide Hard Masks on POlysilicon Gate Electrodes in Anhydrous HF Gases", Japanese Journal of Applied Physics, vol. 43, No. 3, pp. 945-951 (2004).

* cited by examiner

METHODS FOR SELECTIVE ETCHING OF A SILICON MATERIAL USING HF GAS WITHOUT NITROGEN ETCHANTS

CROSS-REFERENCE TO RELATED APPLICATIONS

This application claims benefit of U.S. patent application Ser. No. 15/043,955, filed Feb. 15, 2016, which claims benefit of U.S. Provisional Application Ser. No. 62/269,695, filed Dec. 18, 2015, both of which are incorporated by reference in their entireties.

BACKGROUND

Field

Embodiments of the present invention generally relate to methods for selectively etching a silicon material disposed on a substrate for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions and beyond, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, multiple materials in the semiconductor structures are often utilized to form high-density of transistor devices.

When forming these features, such interconnection structures in a film stack disposed on a substrate, an etch process using a photoresist layer as an etching mask is often utilized. Typically, conventional etchants have low selectivity to etch one material over another material present in the structure, such as gate dielectric, gate electrode and/or underlying materials in a gate structure, thereby leaving void space, also known as silicon recess, foot, or other associated defects on the interface of different materials. Low selectivity of the etchants between different materials often result in etching profile deformation, specifically forming defects on sidewalls, corners, or bottom the substrate surface which may deteriorate device performance and electrical properties of the device structure.

Thus, the etch selectivity for polysilicon and silicon materials to other silicon containing compounds, such as silicon oxide, silicon carbide or silicon nitride, in the device structure should be very high in order to protect or passivate the sidewall, features or the surface of the device structure.

Thus, there is a need for improved methods for etching a silicon material with high selectivity for semiconductor chip manufacturing applications and other semiconductor devices.

SUMMARY

The present disclosure provides methods for etching a silicon material in a device structure in semiconductor applications. In one example, a method for etching features in a silicon material includes performing a remote plasma process formed from an etching gas mixture including HF gas without nitrogen etchants to remove a silicon material disposed on a substrate.

In another example, a method for etching features in a silicon material includes supplying an etching gas mixture including a HF gas and a nitrogen free hydrogen containing gas through a remote plasma source to a silicon material disposed on a substrate in a processing chamber, and applying a remote plasma power in the remote plasma source to generate a remote plasma from the etching gas mixture to etch the silicon material disposed on the substrate.

In yet another example, a method for forming features in a silicon material includes selectively etching a silicon material disposed on a substrate by using a remote plasma containing HF gas and $H_2$ gas without nitrogen etchants.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention generally relate to methods and apparatus for etching a silicon material from a device structure disposed on a substrate. In one example, the method includes etching a silicon material from a remote plasma source including HF etchants with optional nitrogen free hydrogen containing gas, such as $H_2$ gas. The HF etchants along with the optional nitrogen free hydrogen containing gas, such as $H_2$ gas, predominantly remove the silicon material from the substrate without attacking other materials included in the structure formed on the substrate, thus providing a selective etching process to etch the silicon material. The HF etchants may be supplied from a remote plasma source so as to gently remove the silicon material without over aggressively attacking the materials disposed on the substrate. The etching gas excludes nitrogen etchants during the etching process.

Figure 1:
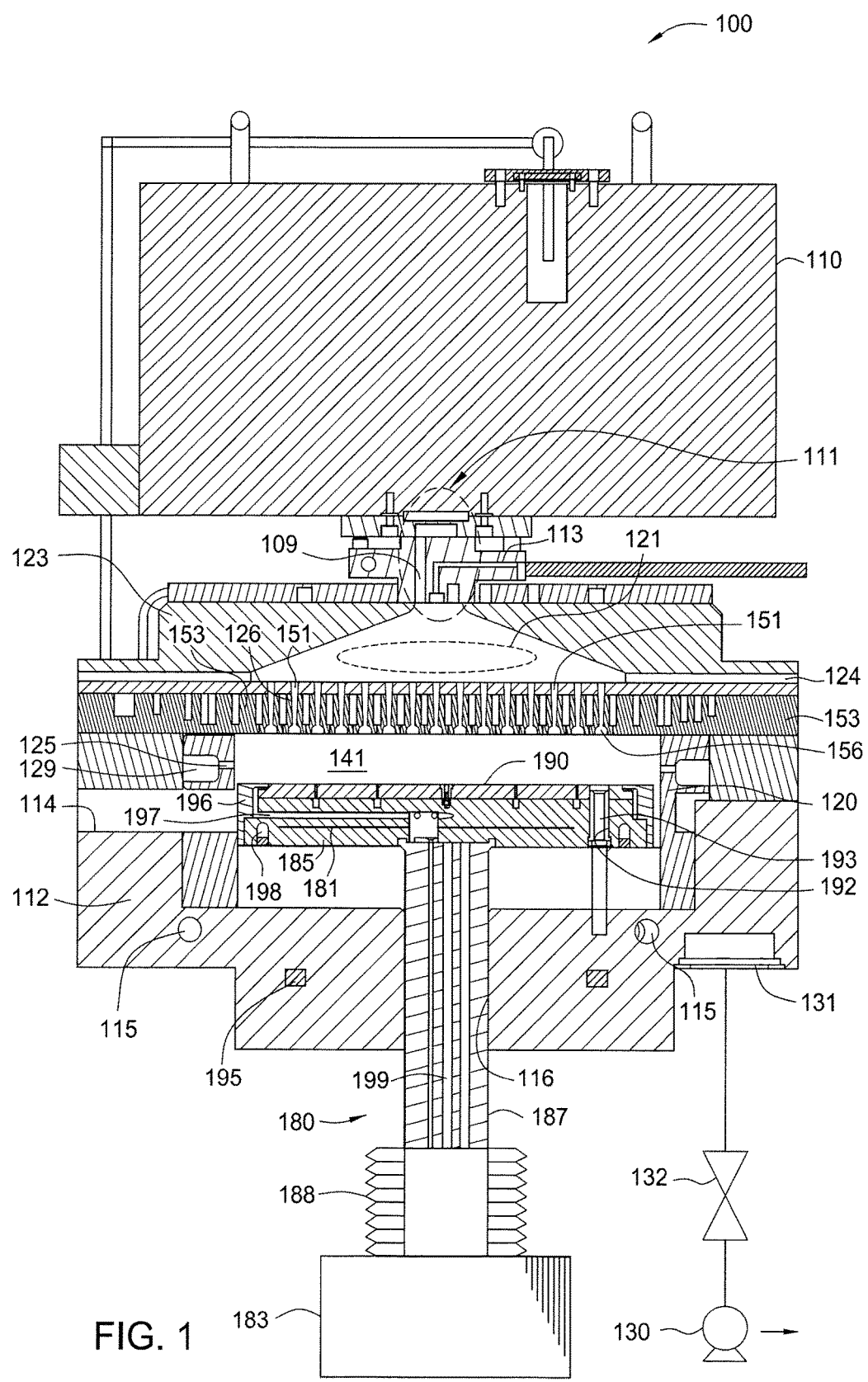
FIG. 1 depicts an etching processing chamber which may be utilized to perform an etching process on a substrate.

FIG. 1 is a cross sectional view of an illustrative processing chamber 100 suitable for a silicon material removal process as further described below. The processing chamber 100 may be configured to remove materials from a material layer disposed on a substrate surface. The processing chamber 100 is particularly useful for performing the plasma assisted dry etch process. The processing chamber 100 may be a Frontier™, PCxT Reactive Preclean™ (RPC), AKTIV Pre-Clean™, Siconi™ or Capa™ chamber, which is available from Applied Materials, Santa Clara, Calif. It is noted that other vacuum processing chambers available from other manufactures may also be adapted to practice the present invention.

The processing chamber 100 includes a chamber body 112, a lid assembly 123, and a support assembly 180. The lid assembly 123 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120.

A remote plasma system 110 may process a halogen containing precursor, for example fluorine-containing precursor, which then travels through a gas inlet assembly 111. Two distinct gas supply channels (a first channel 109 and a second channel 113) are visible within the gas inlet assembly 111. The first channel 109 carries a gas that passes through the remote plasma system 110 (RPS), while the second channel 113 bypasses the remote plasma system 110. Either channel 109, 113 may be used for the halogen-containing precursor. On the other hand, the first channel 109 may be used for the process gas and the second channel 113 may be used for a treatment gas. A lid assembly (or conductive top portion) 123 and a perforated partition 153 (or called a showerhead) are shown with an insulating ring 124 in between, which allows an AC potential to be applied to the lid assembly 123 relative to the perforated partition 153. The AC potential strikes a plasma in a chamber plasma region 121. The process gas may travel through the first channel 109 into the chamber plasma region 121 and may be excited by a plasma in the chamber plasma region 121 alone or in combination with the remote plasma system 110. If the process gas flows through the second channel 113, then only the chamber plasma region 121 is used for excitation. The combination of the chamber plasma region 121 and/or the remote plasma system 110 may be referred to as a remote plasma system herein. The perforated partition (also referred to as a showerhead) 153 separates the chamber plasma region 121 from a substrate processing region 141 beneath the perforated partition 153. The perforated partition 153 allows a plasma present in the chamber plasma region 121 to avoid directly exciting gases in the substrate processing region 141, while still allowing excited species to travel from the chamber plasma region 121 into the substrate processing region 141.

The perforated partition 153 is positioned between the chamber plasma region 121 and the substrate processing region 141 and allows plasma effluents (excited derivatives of precursors or other gases) created within remote plasma system 110 and/or the chamber plasma region 121 to pass through a plurality of through-holes 156. The perforated partition 153 also has one or more hollow volumes 151 which can be filled with a precursor in the form of a vapor or gas and pass through the through-holes 156 into the substrate processing region 141 but not directly into the chamber plasma region 121. In order to maintain a significant concentration of excited species penetrating from the chamber plasma region 121 to the substrate processing region 141, the length 126 of the through-holes 156 may be restricted and configured in different configurations as needed.

The perforated partition 153 may be configured to serve the purpose of an ion suppressor as shown in FIG. 1. Alternatively, a separate processing chamber element may be included (not shown) which suppresses the ion concentration traveling into the substrate processing region 141. The lid assembly 123 and the perforated partition 153 may function as a first electrode and second electrode, respectively, so that the lid assembly 123 and the perforated partition 153 may receive different electric voltages. In these configurations, electrical power (e.g., RF power) may be applied to the lid 123, the perforated partition 153, or both. For example, the electrical power may be applied to the lid assembly 123 while the perforated partition 153 (serving as ion suppressor) is grounded. The substrate processing system 100 may include a RF generator that provides the electrical power to the lid assembly 123 and/or the perforated partition 153 as needed. The voltage applied to the lid assembly 123 may facilitate a uniform distribution of plasma (i.e., reduce localized plasma) within the chamber plasma region 121. To enable the formation of a plasma in the chamber plasma region 121, the insulating ring 124 may electrically insulate the lid assembly 123 from the perforated partition 153. The insulating ring 124 may be made from a ceramic and may have a high breakdown voltage to avoid sparking. Portions of substrate processing chamber 100 near the capacitively-coupled plasma components just described may further include a cooling unit (not shown) that includes one or more cooling fluid channels to cool surfaces exposed to the plasma with a circulating coolant (e.g., water).

In the embodiment shown, the perforated partition 153 may distribute (via through-holes 156) process gases which contain hydrogen, fluorine and/or plasma effluents of such process gases upon excitation by a plasma in the chamber plasma region 121. In embodiments, the process gas introduced into the remote plasma system 110 and/or the chamber plasma region 121 may contain fluorine (such as $F_2$ or HF). The process gas may also include a carrier gas such as helium, argon, hydrogen ($H_2$), etc. Plasma effluents may include ionized or neutral derivatives of the process gas and may also be referred to herein as radical-fluorine referring to the atomic constituent of the process gas introduced.

The through-holes 156 are configured to suppress the migration of ionically-charged species out of the chamber plasma region 121 while allowing uncharged neutral or radical species to pass through the perforated partition 153 into the substrate processing region 141. These uncharged species may include highly reactive species that are transported with less-reactive carrier gas by the through-holes 156. As noted above, the migration of ionic species by the through-holes 156 may be reduced, and in some instances completely suppressed. Controlling the amount of ionic species passing through the perforated partition 153 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., silicon nitride/oxide:silicon etch ratios).

In embodiments, the number of the through-holes 156 may be between about 60 and about 2000. The through-holes 156 may have a variety of shapes but are most easily made round. There is also latitude in choosing the cross-sectional shape of through-holes, which may be made conical, cylindrical or combinations of the two shapes. The through-holes 256 may be configured to control the passage of the plasma-activated gas (i.e., the ionic, radical, and/or neutral species) through the perforated partition 153. For example, the aspect ratio of the holes (i.e., the hole diameter to length) and/or the geometry of the holes may be controlled so that the flow of ionically-charged species in the activated gas passing through the perforated partition 153 is reduced. The through-holes 156 in the perforated partition 153 may include a tapered portion that faces the chamber plasma region 121, and a cylindrical portion that faces the substrate processing region 141. The cylindrical portion may be proportioned and dimensioned to control the flow of ionic species passing into the substrate processing region 141. An adjustable electrical bias may also be applied to the perforated partition 153 as an additional means to control the flow of ionic species through the perforated partition 153.

Alternatively, the through-holes 156 may have a smaller inner diameter (ID) toward the top surface of the perforated partition 153 and a larger ID toward the bottom surface. In addition, the bottom edge of the through-holes 156 may be chamfered to help evenly distribute the plasma effluents in the substrate processing region 141 as the plasma effluents exit the showerhead and promote even distribution of the plasma effluents and precursor gases. The smaller ID may be placed at a variety of locations along the through-holes 156 and still allow the perforated partition 153 to reduce the ion density within the substrate processing region 141. The reduction in ion density results from an increase in the number of collisions with walls prior to entry into the substrate processing region 141. Each collision increases the probability that an ion is neutralized by the acquisition or loss of an electron from the wall. Generally speaking, the smaller ID of the through-holes 156 may be between about 0.2 mm and about 20 mm. In other embodiments, the smaller ID may be between about 1 mm and 6 mm or between about 0.2 mm and about 5 mm. Further, aspect ratios of the through-holes 156 (i.e., the smaller ID to hole length) may be approximately 1 to 20. The smaller ID of the through-holes 156 may be the minimum ID found along the length of the through-holes. The cross sectional shape of through-holes 156 may be generally cylindrical, conical, or any combination thereof.

The support assembly 180 can include a support member 185 to support a substrate (not shown in FIG. 1) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within processing chamber 100.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
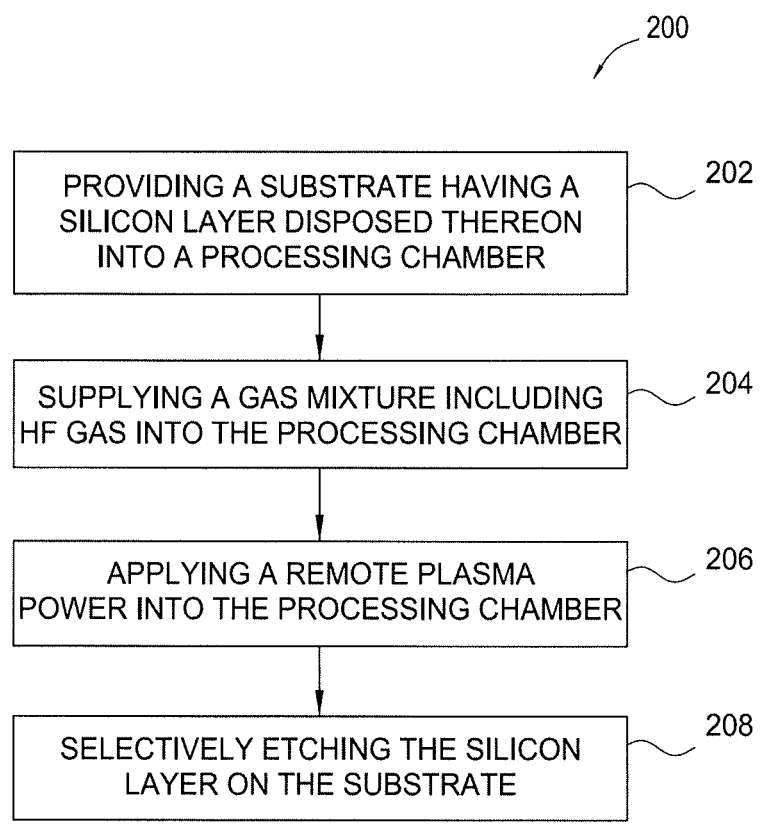
FIG. 2 depicts a flow diagram of a method for a silicon material disposed on a substrate to form features in the silicon material.
Figure 3A:
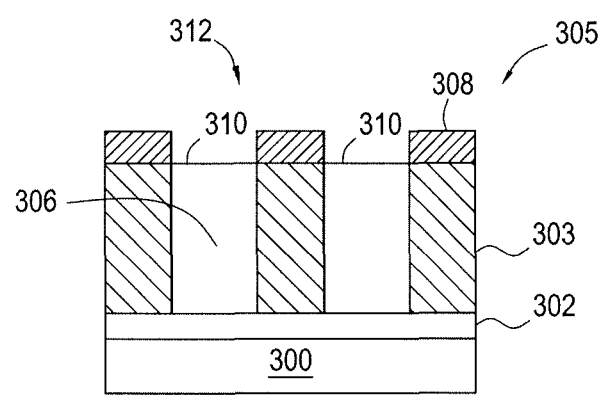
FIG. 3A-3B depict cross sectional views of one example of a sequence for etching the silicon material disposed on the substrate depicted in FIG. 2.
Figure 3B:
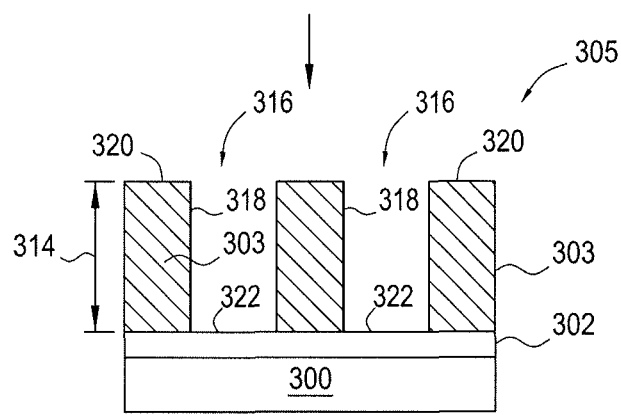

FIG. 2 illustrates a method 200 for etching a silicon material disposed on a substrate, which may be later utilized to form a device structure for semiconductor devices, such as a gate structure, a contact structure, a STI structure, a back-end interconnection structure, or any suitable structures as needed. FIGS. 3A-3B are cross-sectional views of a portion of a silicon material 306 disposed on a substrate 300 with corresponding to various stages of the method 200. In one example, the silicon material 306 may be utilized to form gate structures for three dimensional (3D) FinFET semiconductor applications. Alternatively, the method 200 may be beneficially utilized to etch or remove residuals for other types of structures.

The method 200 begins at operation 202 by transferring a substrate, such as the substrate 300 depicted in FIG. 3A, having a film stack 305 formed on an optional material layer 302 disposed on the substrate 300 into a processing chamber, as shown in FIG. 3A. The substrate 300 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 203 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The optional material layer 302 is disposed between the substrate 300 and the film stack 305. In the embodiments wherein the optional material layer 302 is not present, the film stack 305 may be directly formed on the substrate 300 as needed. In one example, the optional material layer 302 is an insulating material. Suitable examples of the insulating material may include silicon oxide material, silicon nitride material, silicon oxynitride material, silicon carbide materials, low-k materials, high-k material or any suitable insulating materials. Alternatively, the optional material layer 302 may be any suitable materials including conductive material or non-conductive material as needed. In one example, the optional material layer 302 is a silicon nitride layer.

The film stack 305 includes at least a silicon material 306 disposed among an insulating material 303 and a patterned mask layer 308 disposed on the insulating material 303. In one example, the insulating material 303 may be a silicon oxide or silicon nitride material. In one example wherein the optional material layer 302 is a silicon nitride layer, the insulating material 303 may be a silicon oxide layer.

It is noted that the silicon material 306 may be later utilized to form a gate structure, a contact structure, an interconnection, a STI (shallow trench isolation) structure or any suitable structures for semiconductor devices, such as a FINFET device structure. In one embodiment, the silicon material 306 may have a thickness between about 45 nm and about 70 nm.

In one example, the silicon material 306 may be a crystalline silicon layer, such as a single crystalline, polycrystalline, or monocrystalline silicon layer, formed by an epitaxial deposition process. Alternatively, the silicon material 306 may be an undoped or a doped silicon layer, including a p-type doped silicon layer or a n-type doped layer. Suitable p-type dopants include B dopants, Al dopants, Ga dopants, In dopants, or the like. Suitable n-type dopants include N dopants, P dopants, As dopants, Sb dopants, or the like. In yet another example, the silicon material 306 may be a Ge doped silicon layer, such as a GeSi layer, or tungsten polysilicon (W/poly), tantalum silicon nitride (TaSiN), and the like. In the embodiment depicted in FIG. 3A, the silicon material 306 is a polysilicon layer having a thickness between about 45 nm and about 60 nm.

In one example, some other materials, such as a dielectric layer selected from a group consisting of silicon oxide, silicon nitride, silicon oxynitride, high-k material, or combinations thereof and the like, may also be formed on desired locations on the substrate 300 as needed. In another example, high-k materials, dielectric materials having dielectric constants greater than 4.0, may also be utilized as needed. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, and aluminum doped hafnium dioxide, among others.

A patterned mask layer 308 with a plurality of openings 312 formed therein may be disposed on the insulating material 303, exposing a portion 310 of the silicon material 306 to facilitate transferring features into the silicon material 306. The patterned mask layer 308 may be a single layer of hardmask layer, photoresist layer, or a composite layer with both a hardmask layer and a photoresist layer. Suitable examples of the hardmask layer, if present, include silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. The photoresist layer, if present, may be any suitable photosensitive resist materials, such as an e-beam resist (for example, a chemically amplified resist (CAR)) and deposited and patterned in any suitable manner. The opening 312 may have a width less than 50 nm, such as less than 30 nm, such as between about 1 nm and about 10 nm, to form features in the silicon material 306 with aspect ratio greater than at least 10:1.

At operation 204, an etching gas mixture free of nitrogen etchants is supplied into the processing chamber 100 to etch the portions 310 of the silicon material 306 exposed by the patterned mask layer 308, as shown in FIG. 3B, until a predetermined depth 314 of a feature 316 is formed in the silicon material 306. The patterned mask layer 308 servers as an etching mask during the etch process of the silicon material 306. The etching gas mixture is continuously supplied to etch the silicon material 306 until the depth 314 of the features 316 are formed in the silicon material 306 exposing the underlying substrate 300 or the optional material layer 302, if present.

In one embodiment, the etching gas mixture selected to etch the silicon material 306 includes at least a HF gas without nitrogen etchants. While supplying the HF gas in the etching gas mixture, a nitrogen free hydrogen containing gas may also be optionally supplied during the etch process. Suitable examples of the nitrogen free hydrogen containing gas include $H_2$, $H_2O$, $H_2O_2$, and the like. An inert gas may also be supplied into the etching gas mixture, as needed, to assist the profile control. Examples of the inert gas supplied in the gas mixture include Ar, He, Ne, Kr, Xe and the like. In one particular example, the etching gas mixture includes HF and $H_2$.

In one embodiment, the HF gas supplied in the etching gas mixture without nitrogen etchants may be maintained at a flow rate by volume between about 10 sccm and about 1000 sccm. The optional nitrogen free hydrogen containing gas, such as $H_2$ gas, may be maintained at a flow rate by volume between about 0 sccm and about 5000 sccm. The optional inert gas may be supplied to the processing chamber at a flow rate by volume between about 0 sccm and about 5000 sccm. Alternatively, the flow amount of the HF gas and the optional nitrogen free hydrogen containing gas may be supplied in the gas mixture by a predetermined ratio. For example, the gas flow rate ratio by volume of the HF gas to the nitrogen free hydrogen containing gas (such as $H_2$) is controlled at between about 1:0 and about 1:25, such as between about 1:0 and 1:10.

The etching gas mixture is supplied through the chamber plasma region 121 into the substrate processing region 141 to form a remote plasma source in the chamber plasma region 121 from the etching gas mixture for etching the silicon material 306. The etching gas mixture supplied in the operation 204 does not include nitrogen etchants, such as a nitrogen containing gas. The nitrogen etchants, as used in the conventional practices, often generate nitrogen byproducts, such as ammonia salt, which may adversely contaminate the substrate surface, film structure, or even the device film properties. It is believed that HF etchants, alone with a nitrogen free hydrogen containing gas, such as $H_2$ gas, supplied in the etching gas mixture without nitrogen etchants may predominantly, selectively and mildly remove the silicon material 306 without damaging the nearly materials, such as Si—O or Si—N bonding from the insulating material 303 and the optional material layer 302, thus providing a good etching selectivity during the silicon material etching process without generating etching byproducts or residuals. It is believed that one of the fluorine based etchants may first break Si—Si bond from the silicon material 306. Subsequently, the fluorine based etchants react with the intermediate reaction product to form $SiF_x$ in gas phase, readily to be pumped out from the processing chamber. Since Si—O bonding in silicon oxide or Si—N bonding in silicon nitride are much stronger than either Si—Si bonding, Si—H bonding or Si—F bonding from silicon material 306, thus, the etching reaction may have low likelihood of attacking Si—O bonding or Si—N bonding from silicon oxide or silicon nitride early than attacking Si—Si bonding from silicon material. As a result, silicon nitride material or silicon oxide material may not likely to be etched away using the fluorine based etchants until the silicon material 306 is removed from the substrate 300. Thus, a high etching selectivity may be obtained by utilizing fluorine based etchants along with the nitrogen free hydrogen gas.

The amount of gases introduced into the processing chamber 100 from the etching gas mixture may be varied and adjusted to accommodate, for example, the thickness of the silicon material 306 to be removed, the geometry of the substrate being cleaned, the volume capacity of the plasma, the volume capacity of the chamber body, as well as the capabilities of the vacuum system coupled to the chamber body.

It is noted that the ration between the HF gas to nitrogen free hydrogen containing gas may also be adjusted to improve the etching selectivity, including the selectivity between the silicon material 306 and the substrate 300 or between the silicon material 306 and other materials disposed on the substrate 300 (e.g., the selectivity of the silicon nitride layer, silicon carbide or the silicon oxide layer to the silicon material 306 or the selectivity of the silicon nitride, silicon carbide or silicon oxide materials to materials in the substrate, such as a silicon material, a conductive material or a metal silicide layer, among others).

At operation 206, a remote plasma power from the power source 152 is generated to form a plasma in the chamber plasma region 121 from the etching gas mixture supplied at operation 204. The plasma generated remotely in the chamber plasma region 121 during the etching process at operation 206 may have the etchants dissociated to form a relatively mild and gentle etchants, so as to slowly, gently and gradually etch the silicon material 306, e.g., an isotropic etching process, until the underlying substrate 300 or the optional material layer 302 is exposed.

As compared to conventional in-situ plasma etching process (typically an un-isotropic etching process), the remote plasma process performed at operation 206 to remove isotropically the silicon material 306 may be controlled to proceed at a slow rate utilizing the remote plasma source from the power source 152. As a result, the remote plasma process provides good control for the interface etching and promotes high etching selectivity so as to allow precise etching end point of the silicon material 306 being removed from the substrate 300 without damaging the adjacent material layer (such as the insulating material 303 and the optional material layer 302) on the substrate 300. The HF etchants along with the H* species from the nitrogen free hydrogen containing gas (such as $H_2$) from the etching gas mixture may chemically react and predominantly remove the silicon material 306 from the substrate 300 without overly aggressive physical bombarding, sputtering or attacking the substrate surface, providing a mild isotropic etching process that slowly and selectively removes the silicon material 306 with desired management on the sidewalls 318 and the top surface 320 or the feature profile.

During the etching process, several process parameters may be regulated to control the etching process. In one exemplary embodiment, a process pressure in the processing chamber 100 is regulated to less than 0.5 Torr, such as between about 10 mTorr and about 100 mTorr. An in-chamber RF source power or RF bias power may or may not be applied during process. In the example described here, in-chamber RF source and bias power is not required. A substrate temperature is maintained between about 20 degrees Celsius to about 250 degrees Celsius, such as between about 25 degrees Celsius and about 200 degrees Celsius, for example about 30 degrees Celsius and 150 degrees Celsius.

At operation 208, the silicon material 306 is selectively etched in the etching process until a bottom surface 322 of the optional material layer 302 or the substrate 300 is exposed, if the optional material layer 302 is not present, as shown in FIG. 3B. As discussed above, the plasma is generated remotely in the remote plasma source. Thus, the HF etchants along with the hydrogen species from $H_2$ gas without nitrogen etchants, which is believed to predominately etch silicon material 306 without attacking other material on the substrate 300, dissociated from the removal gas mixture from the remote plasma is relatively mild and gentle, so as to slowly, gently and gradually chemically react and isotropically etch the silicon material 306 in a steady manner so that the silicon material 306 may be removed in a mild/gentle manner without attacking or damaging other regions, e.g., other regions fabricated from materials other than silicon, such as silicon oxide, silicon nitride or silicon carbide, so as to enable a successful selective removal process.

Thus, methods for etching a silicon material to form features with desired profile and dimensions in the silicon material for three dimensional (3D) device structure of semiconductor chips are provided. The methods utilize a remote plasma process including HF etchants along with hydrogen species from nitrogen free hydrogen containing gas, such as $H_2$ gas, to selective etch the silicon material without attacking other portions of the substrate so as to promote etching selectivity. As such, a device structure with desired silicon material profile as well as a good pertaining of other materials/structures remained on the substrate is then obtained.

While the foregoing is directed to embodiments of the present invention, other and further embodiments of the invention may be devised without departing from the basic scope thereof, and the scope thereof is determined by the claims that follow.

What is claimed is:

1. A method for etching features in a silicon material, the method comprising:
   supplying an etching gas mixture including HF gas without nitrogen etchants and a nitrogen free hydrogen containing gas to a substrate disposed in a processing chamber to remove at least a portion of a silicon material disposed on the substrate, wherein a rate ratio by volume of the HF gas without nitrogen etchants to the nitrogen free hydrogen containing gas is controlled at between about 25:1 and about 1:25; and
   maintaining the substrate at a temperature of between about 20 degrees Celsius and about 250 degrees Celsius.

2. The method of claim 1, wherein the nitrogen free hydrogen containing gas is $H_2$.

3. The method of claim 1, wherein the etching gas mixture further comprises an inert gas.

4. The method of claim 3, wherein the inert gas is Ar gas or He gas.

5. The method of claim 1, wherein maintaining the substrate at the temperature further comprises:
   maintaining the substrate at a temperature of between about 30 degrees Celsius and about 110 degrees Celsius.

6. The method of claim 1, wherein the silicon material is an undoped polysilicon layer or a doped polysilicon layer.

7. The method of claim 1, wherein the silicon material may be utilized to form a FINFET device structure on the substrate.

8. The method of claim 1, wherein supplying the etching gas mixture further comprises:
   selectively etching the silicon material on the substrate substantially without etching dielectric layers present on the substrate.

9. The method of claim 8, wherein the dielectric layers are selected from a group consisting of silicon oxide layer, silicon nitride layer, silicon oxynitride layer, silicon carbide, low-k material, high-k materials, and combinations thereof.

10. The method of claim 1, further comprising:
    forming features with high aspect ratio greater than 10:1 in the silicon material.

11. The method of claim 1, wherein supplying the etching gas mixture further comprises:
    maintaining a process pressure less than 0.5 Torr.

12. The method of claim 1, wherein the rate ratio by volume of the HF gas without nitrogen etchants to the nitrogen free hydrogen containing gas is controlled at between about 1:1 and about 10:1.

13. A method for forming features in a silicon material, comprising:
    selectively etching a silicon material disposed on a substrate by using an etching gas mixture including HF gas and $H_2$ gas without nitrogen etchants, wherein a rate ratio by volume of the HF gas to the $H_2$ gas is controlled at between about 25:1 and about 1:25;
    maintaining the substrate at a temperature of between about 20 degrees Celsius and about 250 degrees Celsius; and
    forming features with high aspect ratio greater than 10:1 in the silicon material.

14. The method of claim 13, wherein forming features with high aspect ratio further comprises:
    forming features in the silicon material by selectively etching the silicon material disposed on the substrate without etching a dielectric material present in the substrate.

15. The method of claim 13, wherein the silicon material is an undoped polysilicon layer or a doped polysilicon layer.

16. The method of claim 12, wherein the rate ratio by volume of the HF gas without nitrogen etchants to the nitrogen free hydrogen containing gas is controlled at between about 1:1 and about 10:1.

* * * * *